(12) United States Patent
Kang et al.

(10) Patent No.: US 11,963,396 B2
(45) Date of Patent: Apr. 16, 2024

(54) DISPLAY DEVICE COMPRISING AT LEAST ONE HEAT DISSIPATION PATTERN

(71) Applicant: LG Display Co., Ltd., Seoul (KR)

(72) Inventors: Minjoo Kang, Seoul (KR); Dohyung Kim, Goyang-si (KR); Jaeho Choi, Gyeongju-si (KR)

(73) Assignee: LG Display Co., Ltd., Seoul (KR)

( * ) Notice: Subject to any disclaimer, the term of this patent is extended or adjusted under 35 U.S.C. 154(b) by 235 days.

(21) Appl. No.: 17/409,544

(22) Filed: Aug. 23, 2021

(65) Prior Publication Data

US 2022/0109124 A1 Apr. 7, 2022

(30) Foreign Application Priority Data

Oct. 5, 2020 (KR) .................. 10-2020-0128105

(51) Int. Cl.
*H10K 50/87* (2023.01)
*H10K 50/842* (2023.01)

(52) U.S. Cl.
CPC ......... *H10K 50/87* (2023.02); *H10K 50/8426* (2023.02)

(58) Field of Classification Search
None
See application file for complete search history.

(56) References Cited

U.S. PATENT DOCUMENTS

| | | |
|---|---|---|
| 7,148,944 B2 | 12/2006 | Kinoshita et al. |
| 7,369,209 B2 | 5/2008 | Kinoshita et al. |
| 9,634,288 B2 | 4/2017 | Park et al. |
| 2004/0179165 A1 | 9/2004 | Kinoshita et al. |
| 2007/0030439 A1 | 2/2007 | Kinoshita et al. |
| 2013/0026503 A1 | 1/2013 | Son et al. |
| 2016/0043349 A1 | 2/2016 | Park et al. |
| 2019/0014402 A1* | 1/2019 | Ahn .................. H05K 7/20963 |
| 2019/0206944 A1 | 7/2019 | Lim et al. |

FOREIGN PATENT DOCUMENTS

| | | |
|---|---|---|
| KR | 10-0709151 B1 | 3/2004 |
| KR | 10-2013-0014111 A | 2/2013 |
| KR | 10-2016-0019574 A | 2/2016 |
| KR | 10-2019-0080994 A | 7/2019 |

\* cited by examiner

*Primary Examiner* — Daniel Whalen
(74) *Attorney, Agent, or Firm* — Fenwick & West LLP

(57) ABSTRACT

A display device includes an encapsulating structure disposed on an array substrate, a bottom cover accommodating therein the array substrate and the encapsulating structure, and at least one heat dissipation pattern disposed between the encapsulating structure and the bottom cover. The heat dissipation pattern may include a porous framework layer and a heat emission layer composed of particles coated on the framework layer. This heat dissipation pattern may allow heat transfer from the encapsulating structure to the bottom cover to be performed more quickly and efficiently.

23 Claims, 14 Drawing Sheets

DISPLAY DEVICE COMPRISING AT LEAST ONE HEAT DISSIPATION PATTERN

CROSS-REFERENCE TO RELATED APPLICATION

The present disclosure claims priority to and the benefit of Korean Patent Application No. 10-2020-0128105, filed on Oct. 5, 2020, the disclosure of which is incorporated herein by reference in its entirety.

BACKGROUND

Field

The present disclosure relates to a display device including a light-emissive element.

Description of Related Art

A display device is applied to various electronic devices such as TVs, mobile phones, laptops and tablets. To this end, research to develop a thinner, lighter and lower power consumption display device is continuing.

Examples of display devices include a liquid crystal display device (LCD), a plasma display panel device (PDP), a field emission display device (FED), an electro-wetting display device (EWD), and an electroluminescent display device (ELDD) (or an organic light emitting display device) and the like.

The organic light emitting display device includes a plurality of pixel areas arranged in a display area on which an image is displayed, and a plurality of organic light-emissive elements respectively corresponding to the plurality of pixel areas. Each organic light-emissive element is a self-light-emissive element that emits light. Thus, the organic light emitting display device has a faster response speed, higher luminous efficiency and luminance, a larger viewing angle, and excellent contrast ratio and color reproduction range, compared to the liquid crystal display device.

The organic light emitting display device includes a driver for controlling a luminance level of each of the plurality of pixel areas, based on an image signal. Moreover, during a turn-on operation of the organic light emitting display device, heat may be generated from the driver and the organic light-emissive element.

Thus, deterioration of the organic light-emissive element may be accelerated due to the heat, and element characteristics of the driver may be changed due to the heat.

Thus, the organic light emitting display device needs to dissipate the heat quickly.

SUMMARY

Thus, a purpose of the present disclosure is to provide a display device that may quickly dissipate the heat.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

An example of the present disclosure provides a display device comprising: an array substrate having a light-emitting array including a plurality of light-emissive elements respectively corresponding to a plurality of pixel areas; an encapsulating structure disposed on the array substrate and sealing the light-emitting array; a bottom cover housing the array substrate and the encapsulating structure; and at least one heat dissipation pattern disposed between the encapsulating structure and the bottom cover. In this connection, the at least one heat dissipation pattern may include: a porous framework layer made of intertwined metallic fibers; and a heat emission layer composed of particles coated on the framework layer, wherein the heat emission layer can emit the heat from the framework layer.

Since the heat dissipation pattern contacts each of the encapsulating structure and the bottom cover, the heat dissipation pattern receives the heat from the encapsulating structure and emits the heat around the heat dissipation pattern and the bottom cover. Due to this heat dissipation pattern, the heat transfer from the encapsulating structure to the bottom cover may be performed more quickly and efficiently, such that the heat dissipation effect for dissipating the heat from the array substrate may be improved. Accordingly, the deterioration of the image quality and the deterioration of the lifespan of the display device may be delayed.

Further, the encapsulating structure may include: a first adhesive film disposed on the array substrate; an encapsulation film disposed on the first adhesive film and made of a metal material; a second adhesive film disposed on the encapsulation film; and a planar reinforcing plate disposed on the second adhesive film.

Thus, due to the encapsulating structure having the encapsulation film of the metal material as disposed between the first and second adhesive films, a path through which external oxygen or moisture penetrates into the light-emitting array may be complicated. Therefore, the deterioration of the characteristics and the lifespan of the light-emitting array may be delayed.

In addition, due to a structure in which the planar reinforcing plate is in close contact with the encapsulation film via the second adhesive film, the heat from the array substrate may be transferred to the reinforcing plate quickly and easily. Further, the rigidity of the display device may be improved due to the reinforcing plate, such that a shape thereof may not be easily deformed due to an external physical impact.

The bottom cover may include a bottom portion facing toward the encapsulating structure, a side portion vertically extending from an edge of the bottom portion, and a through-hole extending through the bottom portion and corresponding to at least a portion of the at least one heat dissipation pattern.

Thus, this through-hole may allow a portion of the heat dissipation pattern to be exposed out of the bottom cover, such that the heat emitting from the heat dissipation pattern may be directly discharged out of the bottom cover. Thus, the heat dissipation effect may be further improved.

According to one embodiment of the present disclosure, the encapsulating structure disposed on the array substrate and sealing the light-emitting array of the array substrate includes a reinforcing plate having a relatively larger thickness. This reinforcing plate is made of a metal material and is thicker and adheres to the encapsulation film via the second adhesive film. As a result, the heat from the array substrate may be easily transferred to the reinforcing plate, such that the heat dissipation effect from the array substrate may be improved.

The display device according to one embodiment of the present disclosure includes the at least one heat dissipation pattern disposed between the encapsulating structure and the bottom cover. Each heat dissipation pattern includes the porous framework layer that facilitates heat transfer and the heat emission layer that is coated on the framework layer and is composed of particles made of a material that emits heat around the heat dissipation pattern. Because the heat transfer from the encapsulating structure to the bottom cover may be facilitated due to this heat dissipation pattern, the heat dissipation effect may be further improved.

According to another embodiment of the present disclosure, the bottom cover may have a through-hole extending through the bottom portion and corresponding to at least a portion of the at least one heat dissipation pattern. Thus, the heat emitting from the heat dissipation pattern may be discharged out of the bottom cover through the through-hole, such that the heat dissipation effect may be further improved.

Effects of the present disclosure are not limited to the above-mentioned effects, and other effects as not mentioned will be clearly understood by those skilled in the art from following descriptions.

DETAILED DESCRIPTIONS

Figure 1:
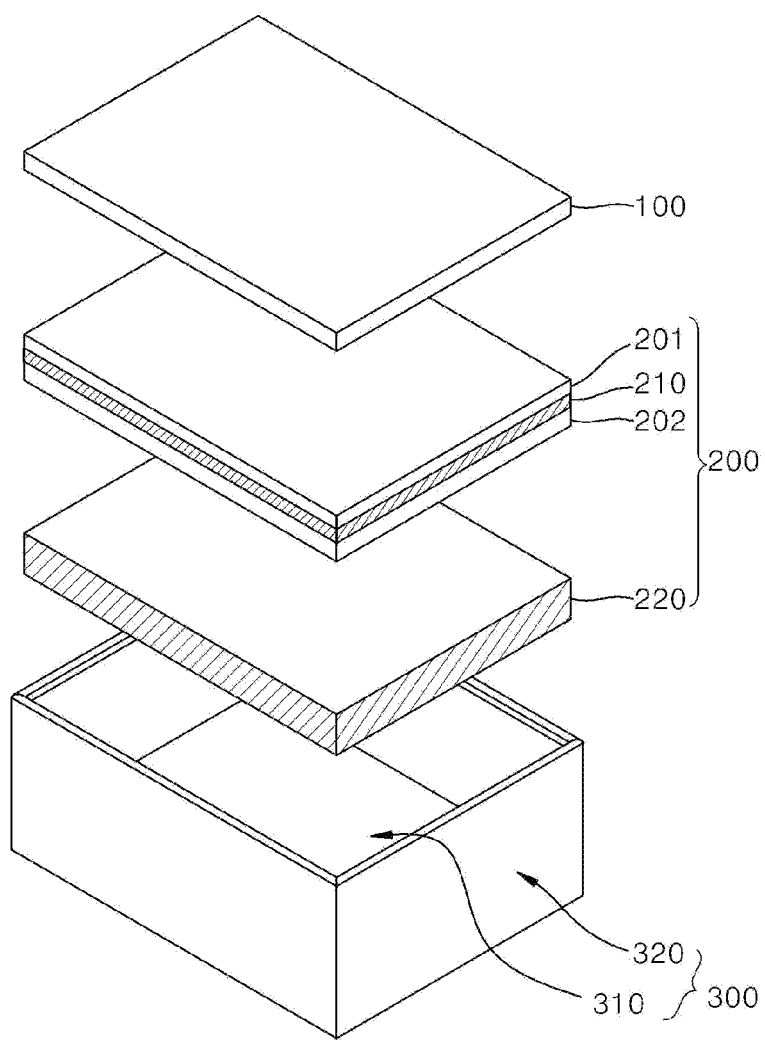
FIG. 1 is an exploded perspective view in a first direction of a display device according to one embodiment of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing embodiments of the present disclosure are exemplary, and the present disclosure is not limited thereto. The same reference numerals refer to the same elements herein. Further, descriptions and details of well-known steps and elements are omitted for simplicity of the description.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on top" of another layer, film, region, plate, or the like, the former may directly contact the latter or still another layer, film, region, plate, or the like may be disposed between the former and the latter. As used herein, when a layer, film, region, plate, or the like is directly disposed "on" or "on top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings is turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

"X axis direction", "Y axis direction" and "Z axis direction" should not be interpreted only to have a geometric relationship in which the X axis direction, the Y axis direction, and the Z axis direction are perpendicular to each other. "X axis direction", "Y axis direction" and "Z axis direction" may be interpreted to have a broader direction within a range in which components herein may work functionally.

Hereinafter, a display device according to each of embodiments of the present disclosure will be described with reference to the attached drawing.

FIG. 1 is an exploded perspective view in a first direction of a display device according to one embodiment of the present disclosure.

As shown in FIG. 1, a display device according to one embodiment of the present disclosure includes an array substrate 100, an encapsulating structure 200 disposed on the array substrate 100, and a bottom cover 300 accommodating therein the array substrate 100 and the encapsulating structure 200.

The array substrate 100 includes a plurality of pixel areas defined in a display area, and a light-emitting array composed of a plurality of light-emissive elements respectively corresponding to the plurality of pixel areas. Moreover, the array substrate 100 further includes a transistor array composed of a plurality of pixel circuits respectively corresponding to the plurality of pixel areas. A light-emissive element corresponding to each pixel area operates based on a drive current supplied from each pixel circuit.

The encapsulation structure 200 includes a first adhesive film 201 disposed on the array substrate 100, an encapsulation film 210 disposed on the first adhesive film 201 and made of a metal material, a second adhesive film 202 disposed on the encapsulation film 210, and a planar reinforcing plate 220 disposed on the second adhesive film 202.

The bottom cover 300 includes a bottom portion 310 facing toward the encapsulating structure 200, and a side portion 320 upwardly extending from an edge of the bottom portion 310 toward the array substrate 100.

Figure 2:
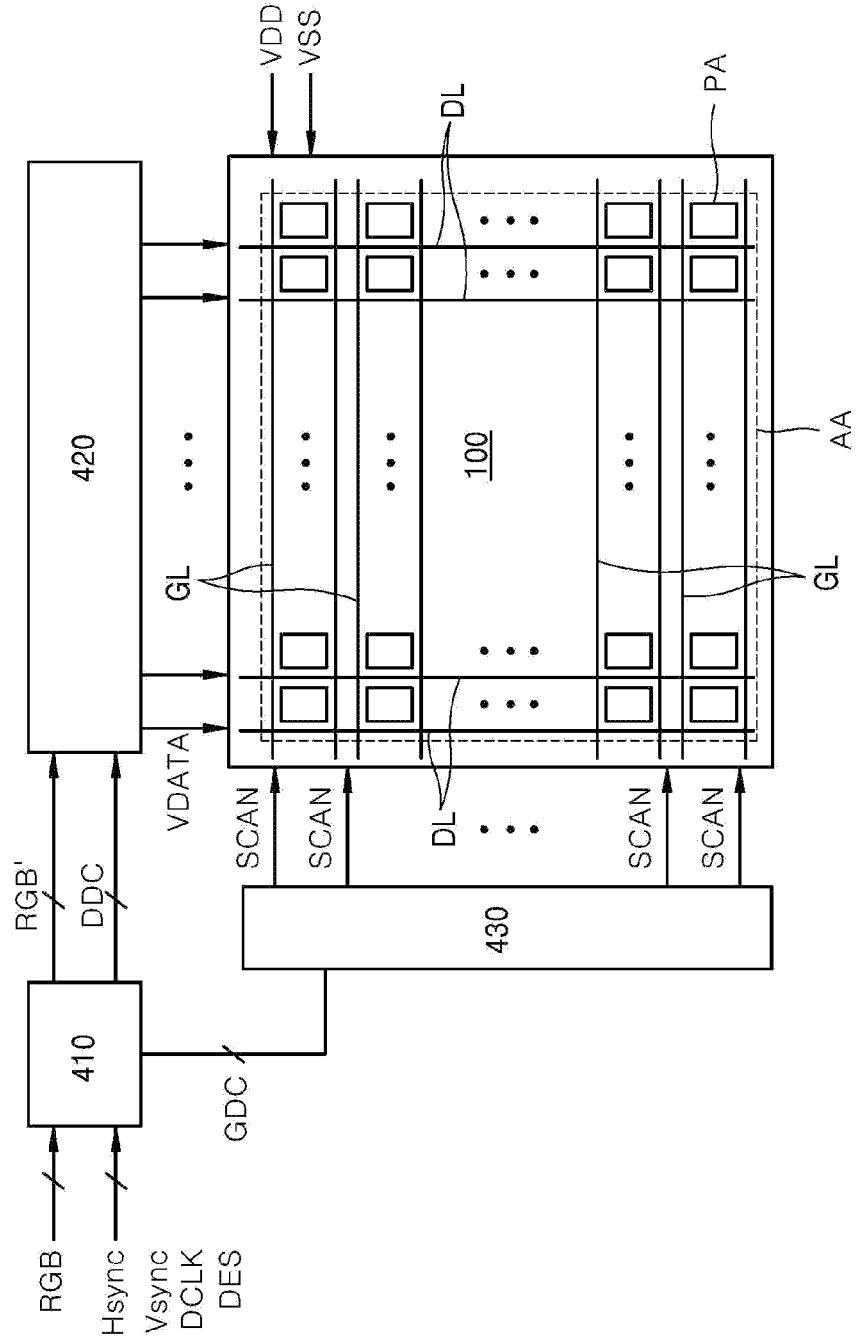
FIG. 2 is a block diagram corresponding to an array substrate in FIG. 1 and a driver driving the array substrate.
Figure 3:
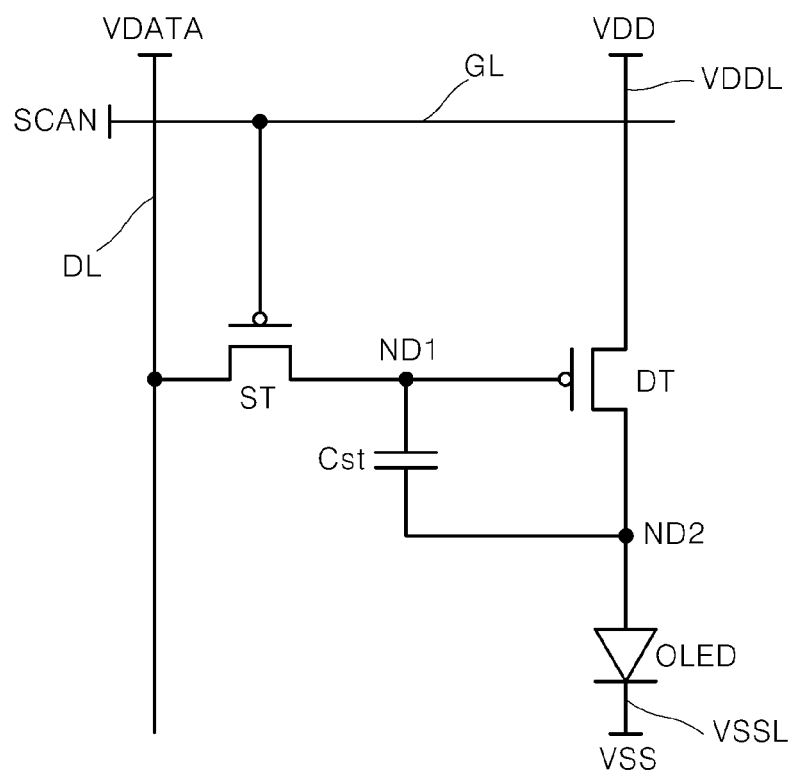
FIG. 3 is a drawing showing an example of an equivalent circuit corresponding to a pixel area of FIG. 2.
Figure 4:
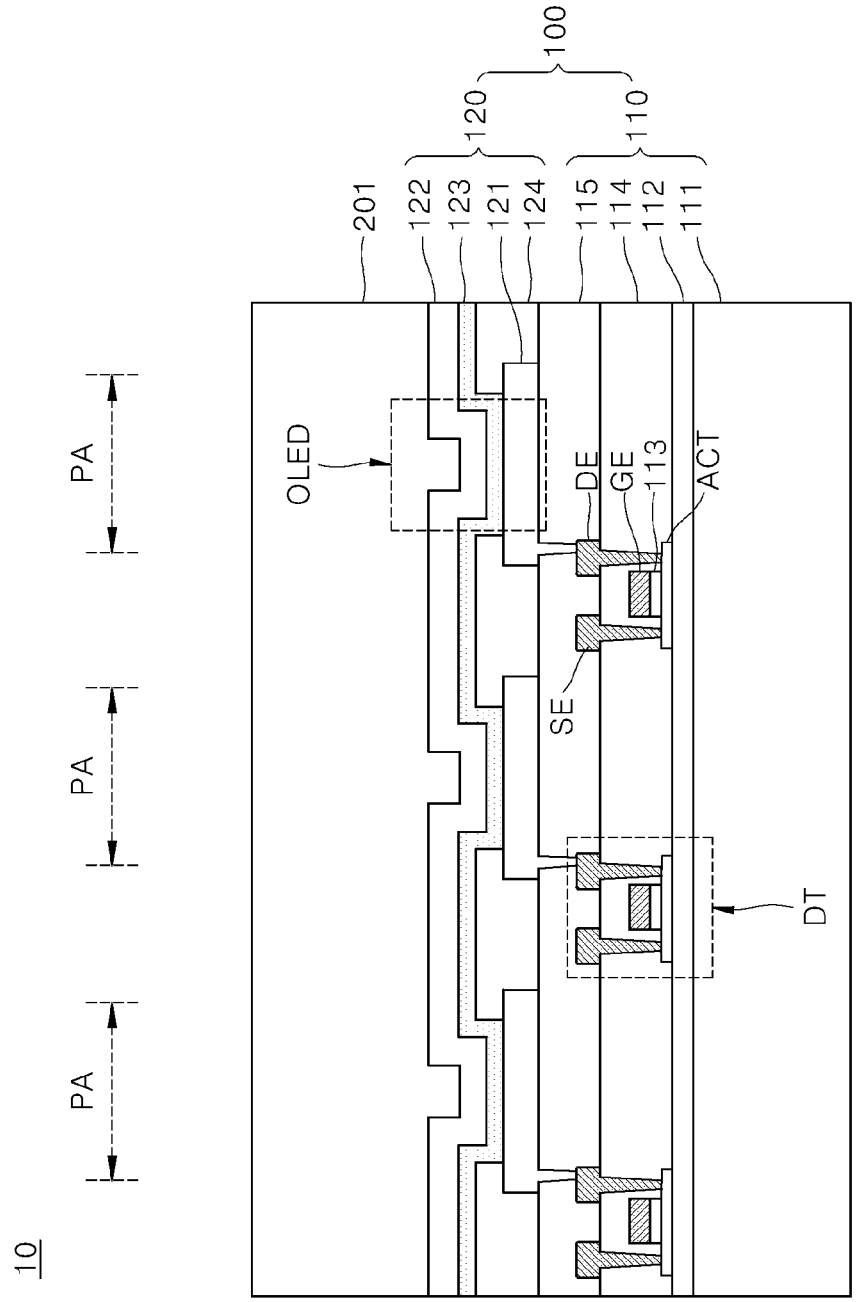
FIG. 4 is a drawing showing an example of a driving thin-film transistor and an organic light-emissive element of FIG. 3.

FIG. 2 is a block diagram corresponding to an array substrate in FIG. 1 and a driver driving the array substrate. FIG. 3 is a drawing showing an example of an equivalent circuit corresponding to a pixel area of FIG. 2. FIG. 4 is a drawing showing an example of a driving thin-film transistor and an organic light-emissive element of FIG. 3.

As shown in FIG. 2, the display device according to one embodiment of the present disclosure includes the array substrate 100 including a display area AA (active area) in which an image is displayed, and drivers that respectively supplies signals to signal lines GL and DL of the array substrate 100.

The array substrate 100 includes a plurality of pixel areas PA defined in the display area AA.

Each of the plurality of pixel areas PA refers to an area for emitting light corresponding to one color. Two or more pixel areas PA adjacent to each other among the plurality of pixel areas PA and corresponding to different colors may constitute a unit pixel for emitting light of various colors. That is, one unit pixel may be realized. The unit pixel may display various colors by combining light beams respectively emitting from two or more pixel areas PA adjacent to each other.

The array substrate 100 includes a gate line GL that supplies a scan signal SCAN for selecting a horizontal line to which a data signal VDATA is to be written, and a data line DL that supplies a data signal VDATA. The horizontal line may be composed of pixel areas arranged in a line in a horizontal direction among the plurality of pixel areas PA.

In addition, the array substrate 100 may further include first and second driving power lines (VDDL and VSSL in FIG. 3) that respectively supply first and second driving powers VDD and VSS, respectively, for operation of the light-emissive element.

The drivers include a timing controller 410, a data driver 420 connected to the data line DL, and a gate driver 430 connected to the gate line GL.

The timing controller 410 rearranges digital video data RGB input from an external system based on a resolution of the array substrate 100, and supplies the rearranged digital video data RGB' to the data driver 420.

The timing controller 410 may generate and supply a data control signal DDC to control an operation timing of the data driver 420, and a gate control signal GDC to control an operation timing of the gate driver 430, based on timing signals such as a vertical synchronization signal Vsync, a horizontal synchronization signal Hsync, a dot clock signal DCLK, and a data enable signal DES.

The gate driver 430 sequentially supplies a scan signal SCAN to a plurality of gate lines GLs during one frame period for displaying an image based on the gate control signal GDC.

That is, the gate driver 430 supplies a scan signal SCAN to each gate line GL during each horizontal period corresponding to each gate line GL during one frame period.

The data driver 420 converts the rearranged digital video data RGB' into an analog data voltage based on the data control signal DDC. The data driver 420 supplies, to the data line DL, a data signal VDATA corresponding to each of the pixel areas PA of the horizontal line to which the scan signal SCAN is supplied during each horizontal period, based on the rearranged digital video data RGB'.

As shown in FIG. 3, each pixel area PA includes an organic light-emissive element OLED, and a pixel circuit for supplying a drive signal to the organic light-emissive element OLED.

In one example, the pixel circuit includes a driving transistor DT, a switching transistor ST, and a storage capacitor Cst. This is merely one example. Although not shown, each pixel area PA may further include a compensation circuit (not shown) for compensating for deterioration of at least one of the driving transistor DT and the light-emissive element OLED. The compensation circuit may include at least one transistor (not shown) to detect a deterioration amount or to supply a reference power (not shown).

The organic light-emissive element OLED includes first and second electrodes, that is, an anode and a cathode, and a light-emitting layer disposed between the first and second electrodes. The light-emitting layer emits light based on the drive current between the first and second electrodes. The organic light-emissive element OLED may have a multi-stack structure including two or more light-emitting layers.

The driving transistor DT may be connected in series to the light-emissive element OLED and may be disposed between a first driving power line VDDL supplying a first driving power VDD and a second driving power line VSSL supplying a second driving power VSS with a lower potential than that of the first driving power VDD.

That is, one end of the driving transistor DT is connected to the first driving power line VDDL, while the opposite end of the driving transistor DT is connected to one end of the light-emissive element OLED. Moreover, the opposite end of the light-emissive element OLED is connected to the second driving power line VSSL.

The switching transistor ST is disposed between a first node ND1 and the data line DL supplying the data signal VDATA of each pixel area PA. The first node ND1 is a contact point between a gate electrode of the driving transistor DT and the switching transistor ST. Moreover, a gate electrode of the switching transistor ST is connected to the gate line GL.

The storage capacitor Cst is disposed between the first node ND1 and a second node ND2. The second node ND2 is a contact point between the driving transistor DT and the organic light-emissive element OLED.

An operation of this pixel circuit is as follows. The switching transistor ST is turned on based on the scan signal SCAN of the gate line GL. In this connection, the data signal VDATA of the data line DL is supplied to the gate electrode of the driving transistor DT and the storage capacitor Cst via the turned-on switching transistor ST and the first node ND1.

The storage capacitor Cst is charged with the data signal VDATA supplied to the first node ND1.

Moreover, the driving transistor DT is turned on based on the data signal VDATA supplied to the first node ND1, and the charged voltage of the storage capacitor Cst to generate a drive current corresponding to the data signal VDATA. Accordingly, the drive current resulting from the turned-on driving transistor DT may be supplied to the second node ND2, that is, to the organic light-emissive element OLED.

As shown in FIG. 4, the array substrate 100 includes a transistor array 110 including a plurality of pixel circuits respectively corresponding to a plurality of pixel areas PA, and a light-emitting array 120 including a plurality of organic light-emissive elements OLED respectively corresponding to the plurality of pixel areas PA.

The transistor array 110 may include a base substrate 111 including a display area AA corresponding to the plurality of pixel areas PAs, and a driving thin-film transistor DT disposed on the base substrate 111 and corresponding to each pixel area PA. Moreover, the transistor array 110 may further include a planarization film 115 that covers the driving thin-film transistor DT in a planarized manner.

The base substrate 111 may be made of an insulating material and may be flat. In one example, the base substrate 111 may be made of glass or plastic.

The driving thin-film transistor DT includes an active layer ACT disposed on a buffer film 112 covering the base substrate 111, a gate insulating layer 113 disposed on a channel area of the active layer ACT, a gate electrode GE disposed on the gate insulating layer 113, an interlayer insulating film 114 covering the buffer film 112, the active layer ACT and the gate electrode GE, a source electrode SE disposed on the interlayer insulating film 114 and connected to a source area of the active layer ACT, and a drain electrode DE disposed on the interlayer insulating film 114 and connected to a drain area of the active layer ACT.

The buffer film 112 may be made of an insulating material that may be easy to adhere to the active layer ACT, such as silicon nitride $SiN_x$ and silicon oxide $SiO_2$. The buffer film 112 may not only help fix the active layer ACT, but also block invasion of moisture or oxygen through the base substrate 111 and prevent defects of the base substrate 111 from transferring to the insulating films 114 and 115 on the base substrate 111. However, depending on the material of the base substrate 111, the buffer layer 112 may be omitted from the transistor array 110.

The active layer ACT may be made of a silicon semiconductor or an oxide semiconductor.

In addition, although not shown in FIG. 4, the transistor array 110 may further include the switching thin-film transistor (ST in FIG. 3), the gate line connected to the gate electrode (GL in FIG. 3) of the switching thin-film transistor ST, and the data line (DL in FIG. 3) connected to one of the source electrode and the drain electrode.

The gate line GL may be disposed on the gate insulating film 113 as the gate electrode GE of the driving thin-film transistor DT may be disposed on the gate insulating film 113.

The data line DL may be disposed on the interlayer insulating film 114 as the source electrode SE and the drain electrode DE of the driving thin-film transistor DT may be disposed on the interlayer insulating film 114.

The interlayer insulating film 114 is disposed on the buffer film 112 and covers the active layer ACT and the gate electrode GE in a planarized manner. The interlayer insulating film 114 may have a structure in which layers made of at least one insulating material selected among organic insulating materials and inorganic insulating materials are stacked vertically. Examples of the inorganic insulating material include silicon nitride $SiN_x$ and silicon oxide $SiO_2$. Examples of organic insulating materials include acryl resin, epoxy resin, phenolic resin, polyamide resin, and polyimide resin.

Like the interlayer insulating film 114, the planarization film 115 may have a structure in which layers made of at least one insulating material selected among organic insulating materials and inorganic insulating materials are stacked vertically.

The light-emitting array 120 may be disposed on the planarization film 115 of the transistor array 110, and may include the plurality of organic light-emissive elements OLED respectively corresponding to the plurality of pixel areas PA.

Each organic light-emissive element OLED may include the opposing first and second electrodes 121 and 122, and the light-emitting layer 123 disposed between the first and second electrodes 121 and 122.

The light-emitting array 120 may include a plurality of first electrodes 121 respectively corresponding to the plurality of pixel areas PA and disposed on the transistor array 110, a bank 124 disposed on the transistor array 110, and disposed out of each pixel area PA, and covering an edge of the first electrode 121, the light-emitting layer 123 disposed on the bank 124 and the first electrode 121, and the second electrode 122 disposed on the light-emitting layer 123 and corresponding to the plurality of pixel areas PA.

The encapsulation structure 200 is disposed on the array substrate 100 and covers the light-emitting array 120. The encapsulating structure 200 may have a structure in which films of different thicknesses and materials are stacked. A portion of the encapsulating structure 200 may be made of an adhesive material.

The first adhesive film 201 of the encapsulation structure 200 covers the light-emitting array 120 in a polarized manner and seals the light-emitting element array 120.

Moreover, as shown in FIG. 1, the encapsulating structure 200 may include a first adhesive film 201 disposed on the array substrate 100, an encapsulation film 210 fixed to the array substrate 100 via the first adhesive film 201, a second adhesive film 202 attached to the encapsulation film 210, and a reinforcing plate 220 attached to the second adhesive film 202.

Figure 5:
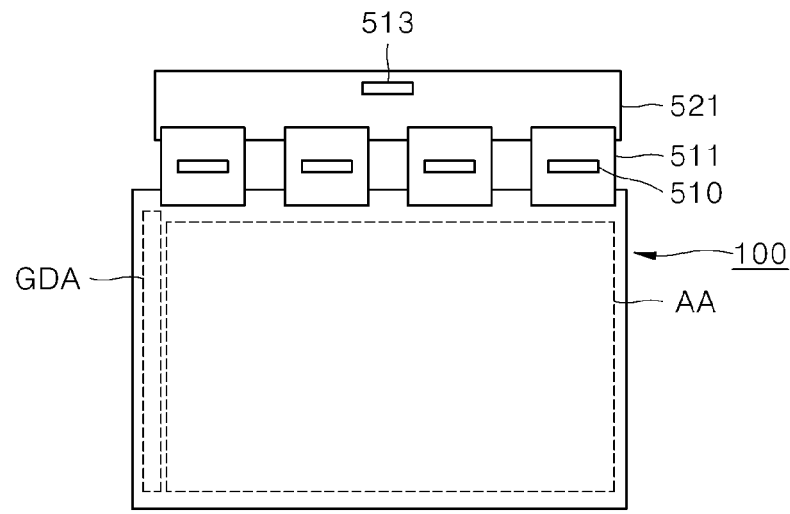
FIG. 5 is a drawing showing an example implementation of an array substrate and a driver in FIG. 2.
Figure 6:
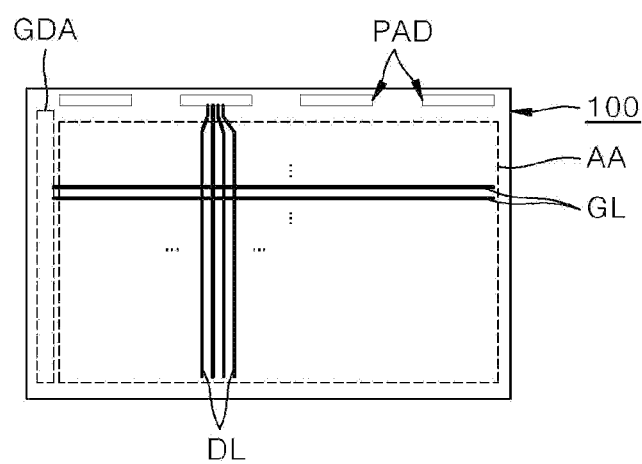
FIG. 6 is a drawing showing an example of the array substrate of FIG. 5.

FIG. 5 is a drawing showing an example implementation of the array substrate and the driver in FIG. 2. FIG. 6 is a drawing showing an example of the array substrate of FIG. 5.

As shown in FIG. 5, the gate driver (430 of FIG. 2) that supplies the scan signal SCAN to the gate line GL may be embedded in the array substrate 100.

In one example, the gate driver (430 in FIG. 2) may be disposed in a partial area GDA (gate driver area) adjacent to one side outer periphery of the display area AA in a non-display area outside of the display area AA.

The data driver (420 in FIG. 2) for supplying the data signal VDATA to the data line DL may be embodied as an integrated circuit chip 510 mounted on a flexible substrate 511.

The flexible substrate 511 on which the integrated circuit chip 510 is mounted may be connected to and disposed between one side edge of the array substrate 100 and a printed circuit board 521.

The timing controller (410 in FIG. 2) may be embodied as an integrated circuit chip 513 mounted on the printed circuit board 521.

As shown in FIG. 6, the array substrate 100 may further include a pad PAD disposed adjacent to the opposite outer periphery of the display area AA in the non-display area.

The flexible substrate 511 on which the integrated circuit chip 510 of the data driver (420 of FIG. 2) is mounted may be connected to the pad PAD.

In this way, the gate driver GDA and the pad PAD may be disposed in the non-display area outside the display area AA of the array substrate 100. Accordingly, relatively high temperature heat may be generated in the edge of the array substrate 100.

In addition, the organic light-emissive element OLED of the pixel area PA disposed in a partial area having a longer operation time or higher driving intensity than other areas of the display area AA may generate a relatively higher temperature heat, compared to organic light-emissive elements OLED in the other areas of the display area AA.

In the specific area where the relatively higher temperature heat is generated, the organic light-emissive element OLED may deteriorate more rapidly or the characteristics of thin-film transistors such as the switching transistor ST and the driving transistor DT may vary such that degradation of an image quality such as an afterimage defect or a stain defect may occur.

Accordingly, a display device according to one embodiment of the present disclosure includes at least one heat dissipation pattern disposed between the encapsulating structure 200 and the bottom cover 300, and thus may be advantageous in terms of heat dissipation.

Figure 7:
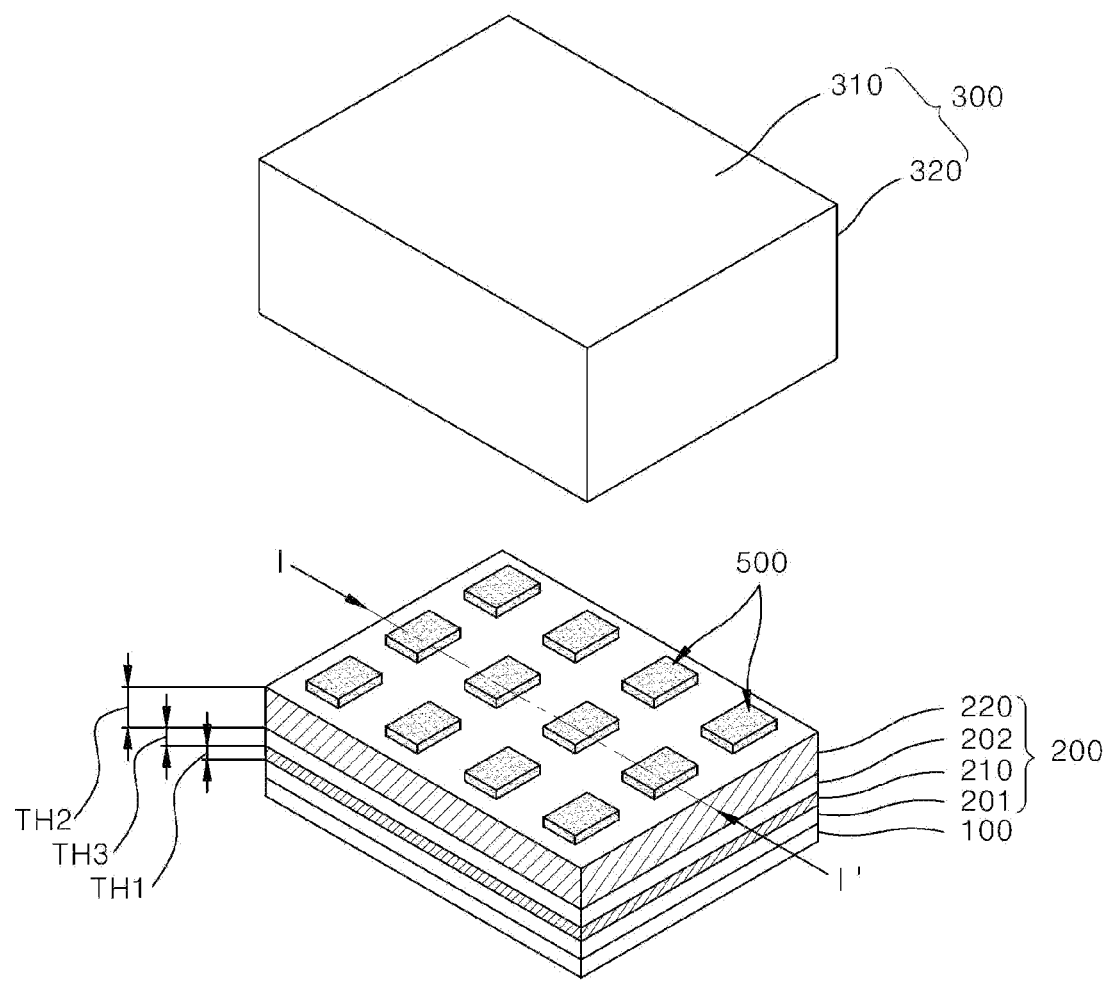
FIG. 7 is an exploded perspective view in a second direction of the display device of FIG. 1.
Figure 8:
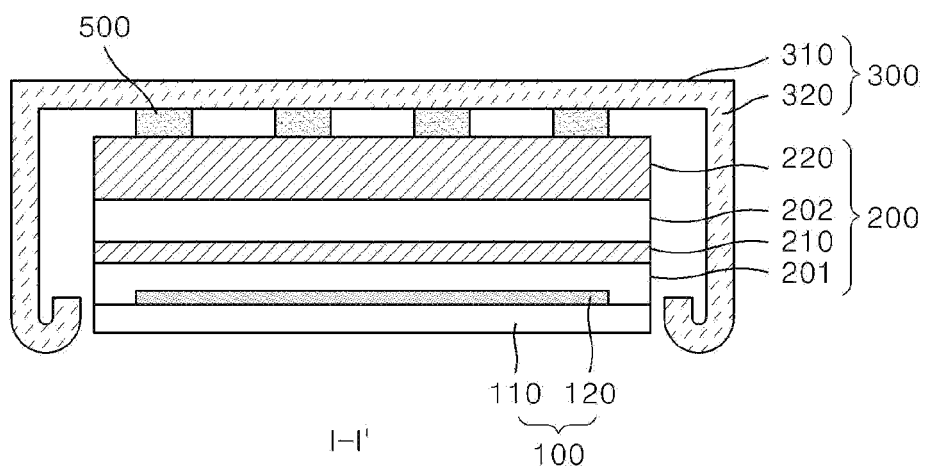
FIG. 8 is a cross sectional view taken along a line I-I' of FIG. 7.
Figure 9:
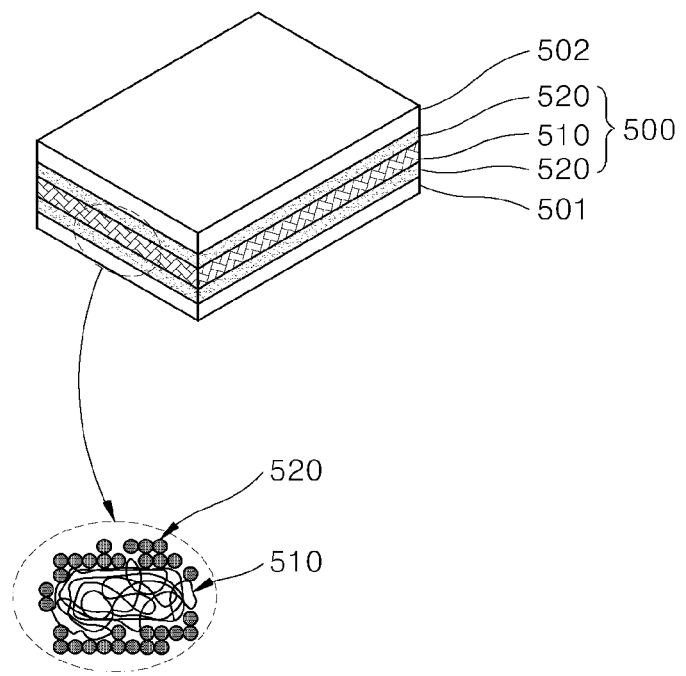
FIG. 9 is a drawing showing a heat dissipation pattern in FIG. 7.

FIG. 7 is an exploded perspective view in a second direction of the display device of FIG. 1. FIG. 8 is a cross sectional view taken along a line I-I' of FIG. 7. FIG. 9 is a drawing showing a heat dissipation pattern in FIG. 7.

As shown in FIG. 7 and FIG. 8, a display device according to one embodiment of the present disclosure may include the array substrate 100 having the light-emitting array (120 in FIG. 4) including a plurality of light-emissive elements (OLED of FIG. 4) respectively corresponding to a plurality of pixel areas (PA in FIG. 4), the encapsulating structure 200 disposed on the array substrate 100 and sealing the light-emitting array 120, the bottom cover 300 housing the array substrate 100 and the encapsulating structure 200, and at least one heat dissipation pattern 500 disposed between the encapsulating structure 200 and the bottom cover 300.

The encapsulation structure 200 includes the first adhesive film 201 disposed on the array substrate 100, the encapsulation film 210 disposed on the first adhesive film 201 made of a metal material, and fixed to the array substrate 100 via the first adhesive film 201, the second adhesive film 202 disposed on the encapsulation film 210, and the planar reinforcing plate 220 disposed on the second adhesive film 202 and fixed to the encapsulation film 210 via the second adhesive film 202.

The first adhesive film 201 seals the light-emitting array 120 of the array substrate 100.

The encapsulation film 210 made of the metal material is disposed between the first and second adhesive films 201 and 202. Accordingly, an invasion path of moisture or oxygen towards the light-emitting array 120 may be complicated, such that performance degradation or lifetime degradation of the light-emissive elements included in the light-emitting array 120 may be delayed.

The encapsulation film 210 may have a thickness smaller than that of the first adhesive film 201. In one example, a thickness TH1 of the encapsulation film 210 may be in a range of 30 μm to 50 μm.

For example, the encapsulation film 210 may be made of an aluminum foil (Al foil). In this way, preparation of the encapsulation film 210 may be facilitated and inexpensive.

The reinforcing plate 220 supports the array substrate 100 and dissipates the heat generated from the array substrate 100.

This reinforcing plate 220 may be made of a metal material having relatively high thermal conductivity to improve the heat dissipation effect from the array substrate 100. In one example, the reinforcing plate 220 may be made of aluminum.

Further, the reinforcing plate 220 may be thicker than the encapsulation film 210 to make it rigid. A thickness TH2 of the reinforcing plate 220 may be 1 mm or greater.

In addition, to improve reliability of fixing the relatively thick reinforcing plate 220, the second adhesive film 202 may be thicker than the first adhesive film 201.

In one example, a thickness TH3 of the second adhesive film 202 may be in a range of 50 μm to 250 μm. The thickness of the second adhesive film 202 may vary in proportion to the thickness of the reinforcing plate 220.

The at least one heat dissipation pattern 500 is disposed in a portion of a space between the encapsulating structure 200 and the bottom cover 300. In other words, the at least one heat dissipation pattern 500 does not correspond to an entirety of the separation space between the encapsulating structure 200 and the bottom cover 300.

Moreover, when a plurality of heat dissipation patterns 500 are provided, the plurality of heat dissipation patterns 500 may be spaced apart from each other.

In one example, as shown in FIG. 7, the plurality of heat dissipation patterns 500 may be arranged in a matrix form and be spaced apart from each other by a first spacing in a first direction and by a second spacing in a second direction, and the second spacing may be different from the first spacing.

Thus, the heat emitting from the heat dissipation pattern 500 may be transferred to a spacing area between the heat dissipation patterns 500, such that the heat dissipation effect as achieved by the heat dissipation pattern 500 may be improved.

One face of each heat dissipation pattern 500 may contact the encapsulating structure 200 while the opposite face of each heat dissipation pattern 500 may contact the bottom portion 310 of the bottom cover 300.

A shape of each of one face and the opposite face of each heat dissipation pattern 500 respectively contacting the encapsulation structure 200 and the bottom cover 300 should not be limited to a specific shape and may be polygonal or circular as an example.

As shown in FIG. 9, each heat dissipation pattern 500 may be disposed between and fixed to the encapsulating structure 200 and the bottom cover 300 via first and second pattern adhesive layers 501 and 502 respectively acting as both opposing faces of each heat dissipation pattern 500.

Each heat dissipation pattern 500 includes a porous framework layer 510 and a heat emission layer 520 surrounding the framework layer 510 and made of a heat-emitting material. In the embodiment as shown in FIG. 9, the heat dissipation pattern 500 includes two heat emission layers 520, one of which is disposed between the framework layer 510 and the first pattern adhesive layer 501, and the other one of which is disposed between the framework layer 510 and the second pattern adhesive layer 502, but the present disclosure is not limited thereto.

The framework layer 510 may be made of metallic fibers intertwined with each other.

In one example, the framework layer 510 may have a thickness of 0.1 mm or smaller.

The heat emission layer 520 may be coated on the framework layer 510 so as to surround the framework layer 510 and may include particles made of a material that emits heat.

The particles of the heat emission layer 520 may be coated on an outer face of the framework layer 510 and may be disposed in a space between the metallic fibers provided in the framework layer 510.

In one example, the particles of the heat emission layer 520 may be made of a silicon-based material. Alternatively, the particles of the heat emission layer 520 may be made of a silicon-based ceramic material.

For example, the particles of the heat emission layer 520 may be made of at least one of $Si_2N_2O$, $CaF_2$, BN, SiC, $SrTiO_3$, and $Na_2SiO_3$.

Moreover, the heat emission layer 520 may have a thickness in a range of 20 μm to 50 μm.

As the heat dissipation pattern 500 is disposed on a portion of the reinforcing plate 220, the heat from the array substrate 100 may be transferred to the framework layer 510 via the reinforcing plate 220 of the encapsulating structure 200, and then may emit around the heat dissipation pattern 500 via the heat emission layer 520. Accordingly, the heat transfer from the encapsulating structure 200 to the bottom cover 300 may be performed more quickly and efficiently.

In one example, according to the illustration of FIG. 7, the at least one heat dissipation pattern 500 may be arranged in a matrix form and may be disposed on the reinforcing plate 220 of the encapsulating structure 200. However, this is only an example. The arrangement of the heat dissipation patterns 500 may correspond to a heat generation distribution in the array substrate 100.

Figure 10:
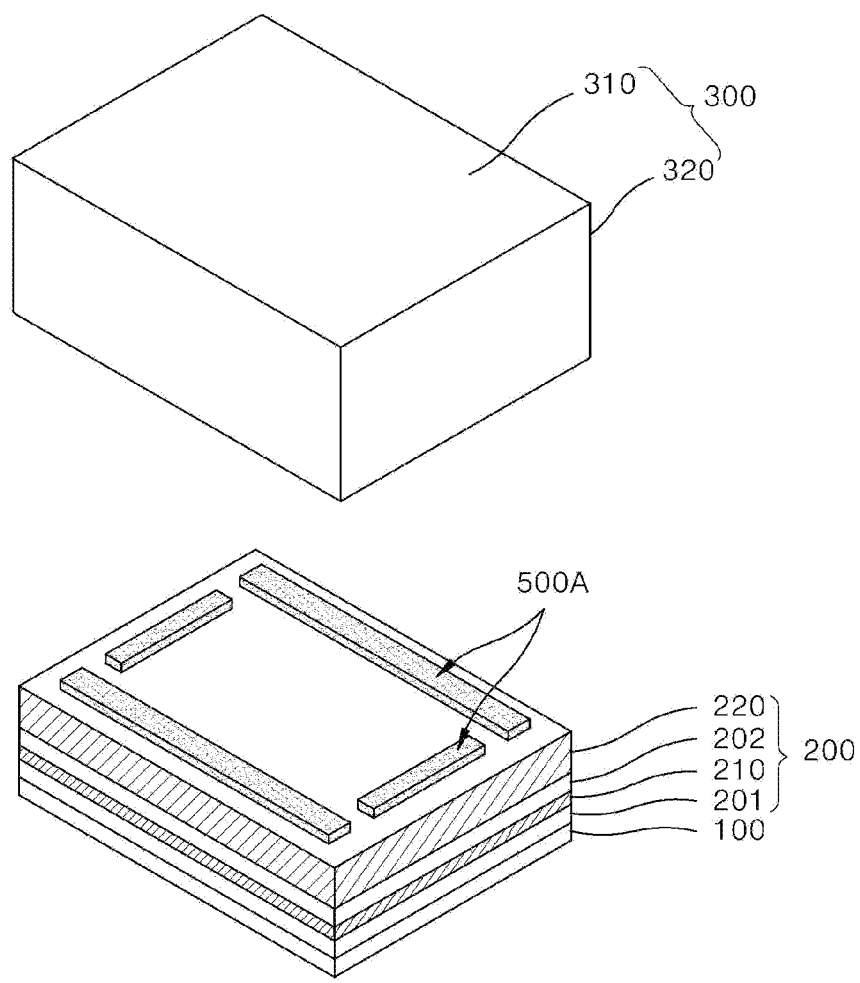
FIG. 10 and FIG. 11 are drawings showing other examples of the heat dissipation pattern of the display device of FIG. 7.
Figure 11:
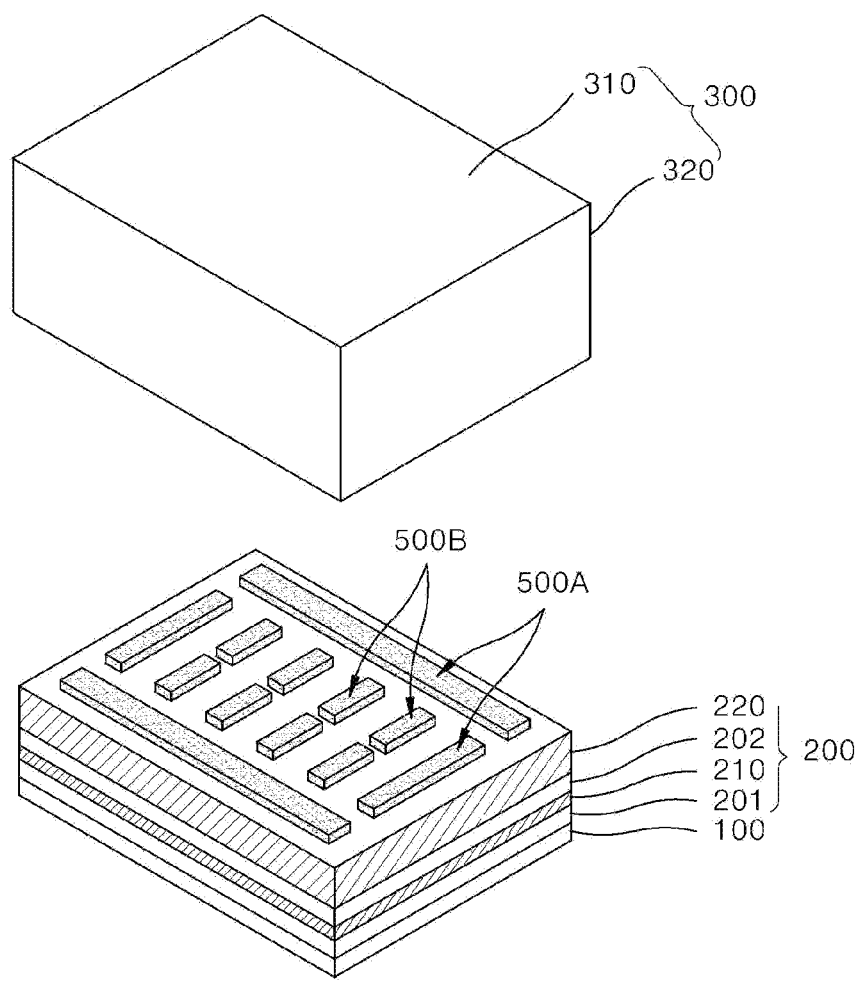

FIG. 10 and FIG. 11 are drawings showing other examples of a heat dissipation pattern in the display device of FIG. 7.

As shown in FIG. 10, a heat dissipation pattern 500A may correspond to an outer periphery of the display area AA of the array substrate 100.

As such, due to the heat dissipation pattern 500A, emission of the heat from at least one of the gate driver (GDA in FIG. 5 and FIG. 6) and the pad (PAD in FIG. 6) disposed adjacent to the outer periphery of the display area AA of the array substrate 100 may be improved.

Alternatively, as shown in FIG. 11, a portion of the heat dissipation patterns (for example, the heat dissipation pattern 500A) may correspond to the outer periphery of the display area AA of the array substrate 100, while another portion of the heat dissipation patterns (for example, a heat dissipation pattern 500B) may be arranged in a matrix form and may be disposed in the display area AA of the array substrate 100.

In one example, the heat transferred to the reinforcing plate 220 and emitting via the heat dissipation patterns 500, 500A, and 500B may be emitted to the outside through the bottom cover 300.

However, a portion of the heat emitting from the heat dissipation pattern 500 may be reflected from the bottom cover 300 and may be directed back to the array substrate 100.

Accordingly, another embodiment of the present disclosure provides a display device in which at least a portion of the heat dissipation pattern 500 may be exposed out of the bottom cover 300, thereby the heat dissipation effect achieved by the heat dissipation pattern 500 may be further improved.

Figure 12:
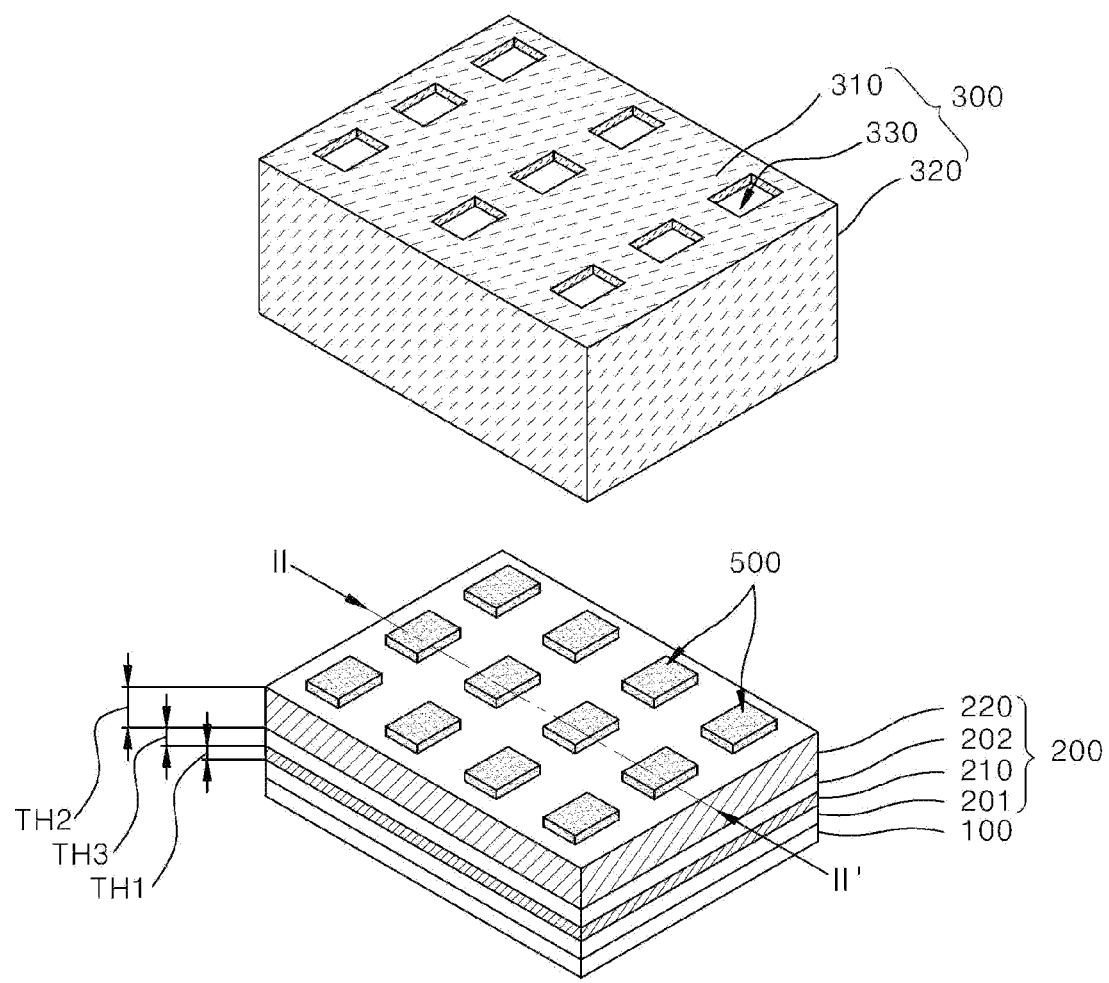
FIG. 12 is an exploded perspective view in a second direction of a display device according to another embodiment of the present disclosure.
Figure 13:
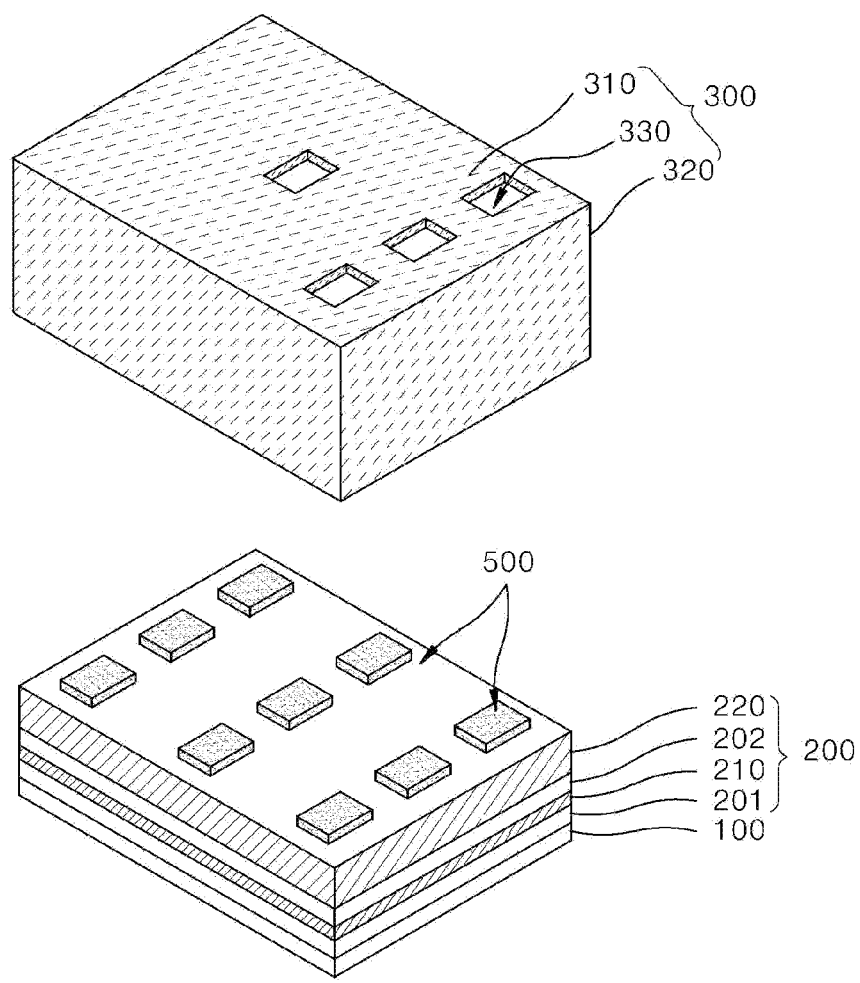
FIG. 13 is a drawing showing another example of a through-hole of the display device of FIG. 12.
Figure 14:
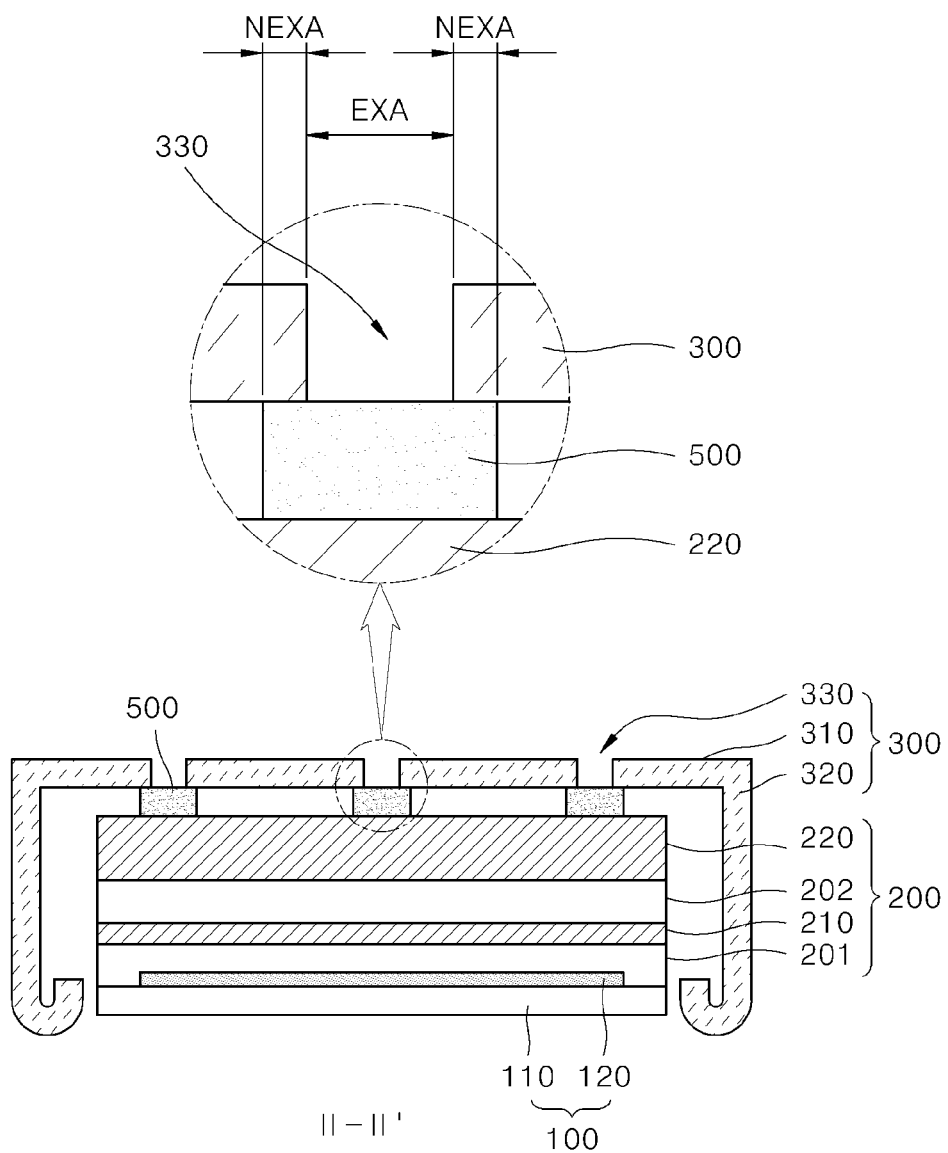
FIG. 14 and FIG. 15 are examples of a cross sectional view taken along a line II-II' in FIG. 12.
Figure 15:
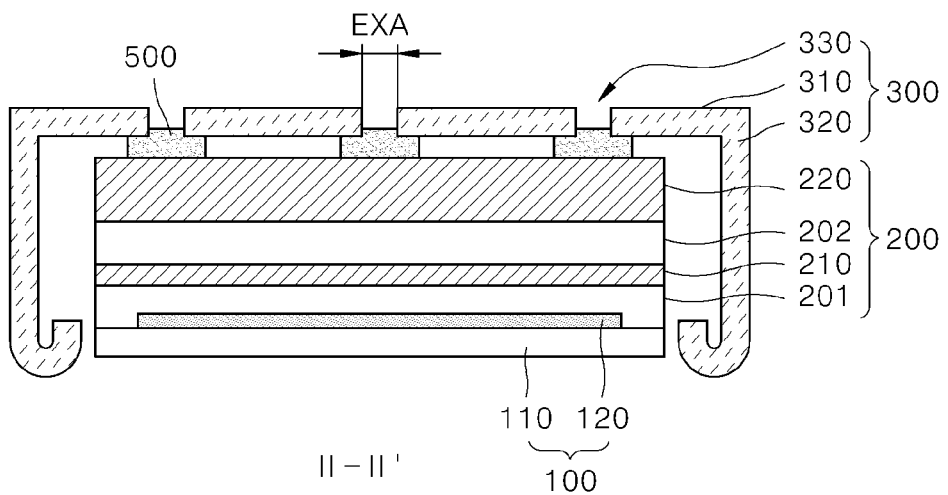

FIG. 12 is an exploded perspective view in a second direction of a display device according to another embodiment of the present disclosure. FIG. 13 is a drawing showing another example of a through-hole in the display device of FIG. 12. FIG. 14 and FIG. 15 are examples of a cross sectional view taken along a line II-II' in FIG. 12.

As shown in FIG. 12, the display device according to another embodiment of the present disclosure is the same as that shown in FIG. 1, FIG. 7 to FIG. 11, except that the bottom cover 300 further has a through-hole 330 defined therein. Hereinafter, duplicate descriptions therebetween are omitted.

As shown in FIG. 12, according to another embodiment of the present disclosure, the bottom cover 300 has the bottom portion 310 facing toward the encapsulating structure 200, the side portion 320 vertically extending from the edge of the bottom portion 310, and at least one through-hole 330 defined in the bottom portion 310 and corresponding to at least a portion of the at least one heat dissipation pattern 500.

In one example, as shown in FIG. 12, the at least one heat dissipation pattern 500 may correspond to the at least one through-hole 330 in one to one manner. As such, the entirety of the heat dissipation pattern 500 may be exposed out of the bottom cover 300 through the through-hole 330, such that the heat emitting from the heat dissipation pattern 500 may directly emit to the outside through the through-hole 330. Accordingly, the heat dissipation effect resulting from the heat dissipation pattern 500 may be further improved.

However, a foreign material may flow into the bottom cover 300 through the through-hole 330. Thus, an arrangement area of the through-hole 330 may be limited to an area where a heat generation level is relatively higher.

That is, as shown in FIG. 13, only a portion of at least one heat dissipation pattern 500 may correspond to the through-hole 330.

In this way, the arrangement of the through-hole 330 may correspond to the distribution of heat generation in the array substrate 100. That is, the arrangement area of the through-hole 330 may be limited to an area of the array substrate 100 where a level of heat generation is relatively higher. In this way, the heat dissipation effect resulting from the heat dissipation pattern 500 may be further improved, while the invasion of the foreign material due to the arrangement of the through-hole 330 may be reduced.

As shown in FIG. 14, each of at least one heat dissipation pattern 500 corresponding to the through-holes 330 of the bottom cover 300 has a width larger than that of the through-hole 330.

Accordingly, each of at least one heat dissipation pattern 500 corresponding to the through-hole 330 of the bottom cover 300 includes an exposed area EXA corresponding to the through-hole 330 and a covered area NEXA corresponding to a peripheral area around the through-hole 330 in an area of the bottom portion 310 of the bottom cover 300.

In this way, the heat emitting from the heat dissipation pattern 500 may be transmitted to the bottom portion 310 of the bottom cover 300 while emitting out of the bottom cover 300 through the through-hole 330. Therefore, the heat dissipation effect resulting from the heat dissipation pattern 500 may be further improved.

Alternatively, based on a ratio between a thickness of the heat dissipation pattern 500 and the spacing between the encapsulating structure 200 and the bottom cover 300, the exposed area EXA of the heat dissipation pattern 500 may be disposed in the through-hole 330 of the bottom cover 300.

That is, as shown in FIG. 15, the exposed area EXA facing toward the through-hole 330 in an area of the heat dissipation pattern 500 may be partially inserted into the through-hole 330. In this way, a contact area between the heat dissipation pattern 500 and the bottom cover 300 may be increased, such that the heat dissipation effect due to the heat dissipation pattern 500 may be further improved. Further, this may be advantageous for slimming the display device.

As described above, the display device according to each of the embodiments of the present disclosure includes the at least one heat dissipation pattern 500 disposed between the encapsulating structure 200 and the bottom cover 300. Each heat dissipation pattern 500 includes the porous framework layer 510 and the heat emission layer 520 coated on the framework layer 510 to surround the framework layer 510 and composed of the particles made of the heat emissive material. This heat dissipation pattern 500 conducts the heat transferred through the encapsulating structure 200 to the bottom cover 300 and emits the heat into the space between the encapsulating structure 200 and the bottom cover 300. As a result, the heat from the array substrate 100 may be emitted more quickly. Thus, the display quality and the lifespan of the display device may be improved.

Moreover, according to each of the embodiments of the present disclosure, the encapsulation structure 200 includes the first adhesive film 201 disposed on the array substrate 100, the encapsulation film 210 disposed on the first adhesive film 201 made of a metal material, and fixed to the array substrate 100 via the first adhesive film 201, the second adhesive film 202 disposed on the encapsulation film 210, and the planar reinforcing plate 220 disposed on the second adhesive film 202 and fixed to the encapsulation film 210 via the second adhesive film 202.

Thus, the first adhesive film 201, the encapsulation film 210 made of the metal material, and the second adhesive film 202 may seal the light-emissive array 120. Thus, the path through which moisture or oxygen penetrates into the light-emissive array 120 may be complicated. Thus, the deterioration of the lifespan, and the properties deterioration of the light-emissive array 120 may be delayed.

In addition, the reinforcing plate 220 may be relatively thick and made of the metal material. Thus, the rigidity of the display device may be improved due to this reinforcing plate 220.

The planar reinforcing plate 220 may be fixedly attached to an entire face of the encapsulation film 210 via the second adhesive film 202. That is, an air layer may be absent between the reinforcing plate 220 and the encapsulation film 210, and the reinforcing plate 220 may be in close contact with the encapsulation film 210. This makes it easier for the heat from the array substrate 100 to be transferred to the reinforcing plate 220. Thus, the heat dissipation effect may be improved.

Further, the heat transferred to the reinforcing plate 220 of the encapsulating structure 200 may easily emit toward the bottom cover 300 via the at least one heat dissipation pattern 500 disposed on the reinforcing plate 220. That is, the heat emission from the reinforcing plate 220 may be performed quickly and easily due to the at least one heat dissipation pattern 500, such that the heat dissipation effect may be further improved.

In the display device according to another embodiment of the present disclosure, the through-hole 330 corresponding to at least a portion of the at least one heat dissipation pattern 500 may extend through the bottom portion 310 of the bottom cover 300.

A portion of the heat dissipation pattern 500 may be exposed out of the bottom cover 300 through the through-hole 330, while the other portion of the heat dissipation pattern 500 may face toward the bottom portion 310 of the bottom cover 300. Accordingly, a portion of the heat emitting from the heat dissipation pattern 500 may directly emit out of the bottom cover 300 via the through-hole 330, while another portion of the heat emitting from the heat dissipation pattern 500 may be transferred to the bottom cover 300. Therefore, the heat dissipation effect due to the heat dissipation pattern 500 may be further improved.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display device comprising:
   an array substrate having a light-emitting array including a plurality of light-emissive elements respectively corresponding to a plurality of pixel areas;
   an encapsulating structure disposed on the array substrate and sealing the light-emitting array;
   a bottom cover housing the array substrate and the encapsulating structure; and
   at least one heat dissipation pattern disposed between the encapsulating structure and the bottom cover,
   wherein the at least one heat dissipation pattern includes:
   a porous framework layer including interwined metallic fibers; and
   a heat emission layer surrounding the framework layer and made of a heat-emitting material, wherein the heat emission layer comprises particles coated on the framework layer, the particles of a material that emits heat, and the heat emission layer can emit the heat from the framework layer.

2. The display device of claim 1, wherein the particles of the heat emission layer are coated on an outer face of the framework layer or disposed in a space between the metallic fibers of the framework layer.

3. The display device of claim 1, wherein the encapsulating structure includes:
   a first adhesive film disposed on the array substrate;
   an encapsulation film disposed on the first adhesive film and comprising metal material;
   a second adhesive film disposed on the encapsulation film; and
   a planar reinforcing plate disposed on the second adhesive film.

4. The display device of claim 3, wherein the encapsulation film has a thickness smaller than that of the first adhesive film.

5. The display device of claim 4, wherein the encapsulation film has a thickness in a range of 30 μm to 50 μm.

6. The display device of claim 3, wherein the encapsulation film comprises an aluminum foil.

7. The display device of claim 3, wherein the reinforcing plate comprises aluminum.

8. The display device of claim 3, wherein the reinforcing plate is thicker than the encapsulation film.

9. The display device of claim 8, wherein the second adhesive film is thicker than the first adhesive film.

10. The display device of claim 3, wherein the second adhesive film has a thickness in a range of 50 μm to 250 μm,
    wherein the encapsulation film is thinner than the second adhesive film,
    wherein the reinforcing plate has a thickness of 1 mm or greater.

11. The display device of claim 3, wherein the reinforcing plate is fixedly attached to an entire face of the encapsulation film via the second adhesive film.

12. The display device of claim 1, wherein the bottom cover includes:
    a bottom portion facing toward the encapsulating structure; and
    a side portion vertically extending from an edge of the bottom portion toward the array substrate,
    wherein one face of the at least one heat dissipation pattern contacts the encapsulating structure, while an opposite face of the at least one heat dissipation pattern contacts the bottom portion of the bottom cover,
    wherein the at least one heat dissipation pattern is disposed in a portion of a space between the encapsulating structure and the bottom cover.

13. The display device of claim 12, wherein the at least one heat dissipation pattern includes a plurality of heat dissipation patterns arranged in a matrix form and spaced apart from each other.

14. The display device of claim 13, wherein the plurality of heat dissipation patterns are spaced apart from each other by a first spacing in a first direction and by a second spacing in a second direction, and the second spacing is different from the first spacing.

15. The display device of claim 12, wherein the at least one heat dissipation pattern is arranged corresponding to a distribution of heat generation in the array substrate.

16. The display device of claim 12, wherein at least a portion of the at least one heat dissipation pattern corresponds to an outer periphery of a display area of the array substrate.

17. The display device of claim 16, wherein another portion of the at least one heat dissipation pattern is disposed in the display area of the array substrate.

18. The display device of claim 12, wherein the bottom portion has at least one through-hole defined therein corresponding to at least a portion of the at least one heat dissipation pattern.

19. The display device of claim 18, wherein the portion of the at least one heat dissipation pattern corresponding to the through-hole of the bottom cover includes:
   an exposed area facing toward the through-hole of the bottom cover: and
   a covered area facing toward a peripheral area around the through-hole in an area of the bottom portion of the bottom cover.

20. The display device of claim 19, wherein the exposed area of the heat dissipation pattern is partially inserted into the through-hole of the bottom cover.

21. The display device of claim 1, wherein the particles of the heat emission layer comprise silicon-based material.

22. The display device of claim 1, wherein the particles of the heat emission layer comprise at least one selected from a group consisting of $Si_2N_2O$, $CaF_2$, BN, SiC, $SrTiO_3$ and $Na_2SiO_3$.

23. The display device of claim 1, wherein the framework layer has a thickness of 0.1 mm or smaller, and
   wherein the heat emission layer has a thickness in a range of 20 μm to 50 μm.

\* \* \* \* \*